US012754080B2

(12) United States Patent
Chen et al.

(10) Patent No.: US 12,754,080 B2
(45) Date of Patent: Oct. 6, 2026

(54) ELECTRONIC DEVICE AND METHOD FOR CALIBRATING TEMPERATURE RELATED SCATTERING MATRIX OF TEMPERATURE SENSITIVE DEVICE

(71) Applicant: MEDIATEK INC., Hsin-Chu (TW)

(72) Inventors: Kuo-Hao Chen, Hsinchu City (TW); Toru Matsuura, San Jose, CA (US)

(73) Assignee: MEDIATEK INC., Hsinchu City (TW)

( * ) Notice: Subject to any disclaimer, the term of this patent is extended or adjusted under 35 U.S.C. 154(b) by 375 days.

(21) Appl. No.: 18/510,685

(22) Filed: Nov. 16, 2023

(65) Prior Publication Data

US 2025/0164320 A1 May 22, 2025

(51) Int. Cl.

| | |
|---|---|
| ***G01K 15/00*** | (2006.01) |
| ***G01K 1/02*** | (2021.01) |
| ***G01K 1/024*** | (2021.01) |
| ***G01K 7/02*** | (2021.01) |
| ***G01R 27/32*** | (2006.01) |
| ***H01Q 15/00*** | (2006.01) |

(Continued)

(52) U.S. Cl.

CPC ............. *G01K 7/021* (2013.01); *G01K 1/024* (2013.01); *G01K 1/026* (2013.01); *G01K 7/023* (2013.01);

(Continued)

(58) Field of Classification Search

CPC ........ G01K 1/024; G01K 1/026; G01K 7/021; G01K 7/023; G01K 15/005;

(Continued)

(56) References Cited

U.S. PATENT DOCUMENTS

| | | | | |
|---|---|---|---|---|
| 10,135,123 | B1 * | 11/2018 | Arnitz | H01Q 1/247 |
| 2013/0163729 | A1 * | 6/2013 | Ericson | H04B 3/46<br>379/1.03 |

(Continued)

FOREIGN PATENT DOCUMENTS

| | | | | | |
|---|---|---|---|---|---|
| CN | 1564457 | A | * | 1/2005 | |
| CN | 114698404 | B | * | 6/2025 | H01Q 1/24 |

OTHER PUBLICATIONS

"Scattering Matrices" by John Staples at <https://uspas.fnal.gov/materials/08UCSC/mml14_scattering_matrices.pdf> (Year: 2007).*

(Continued)

*Primary Examiner* — Randy W Gibson
(74) *Attorney, Agent, or Firm* — Winston Hsu

(57) ABSTRACT

An electronic device and a method for calibrating a temperature related scattering matrix (S-matrix) of a temperature sensitive device are provided. The electronic device includes a temperature sensitive device for receiving a forward signal and a reverse signal corresponding to a desired signal and a calibration kit for providing a switchable impedance. During a first phase, the electronic device operates in a first temperature, and multiple first calculation results are calculated according to the forward signal and the reverse signal by setting the switchable impedance to be multiple impedances, respectively. During a second phase, the electronic device operates in a second temperature, and multiple second calculation results are calculated according to the forward signal and the reverse signal by setting the switchable impedance to be the multiple impedances, respectively. In addition, the temperature related S-matrix is calibrated according to the multiple first calculation results and the multiple second calculation results.

16 Claims, 3 Drawing Sheets

(51) Int. Cl.

| | |
|---|---|
| ***H02J 50/20*** | (2016.01) |
| ***H04B 3/46*** | (2015.01) |
| *G01R 35/00* | (2006.01) |
| *H04B 1/04* | (2006.01) |

(52) U.S. Cl.

CPC ....... *G01K 15/005* (2013.01); *G01K 2217/00* (2013.01); *G01R 27/32* (2013.01); *G01R 35/005* (2013.01); *H01Q 15/0066* (2013.01); *H02J 50/20* (2016.02); *H04B 1/0458* (2013.01); *H04B 3/46* (2013.01)

(58) Field of Classification Search

CPC .... G01K 2217/00; H04B 1/0458; H04B 3/46; H04B 7/0413; H02J 50/20; G01R 27/32; G01R 35/005; H01Q 15/0066

See application file for complete search history.

(56) References Cited

U.S. PATENT DOCUMENTS

| | | | | |
|---|---|---|---|---|
| 2016/0182096 | A1 * | 6/2016 | Panioukov | H04B 1/0458 343/861 |
| 2018/0205152 | A1 * | 7/2018 | Tegreene | H04B 7/0413 |
| 2019/0097460 | A1 * | 3/2019 | Black | H02J 50/20 |

OTHER PUBLICATIONS

"What is a Vector Network Analyzer and How Does it Work?" from Tektronix at <https://www.tek.com/en/documents/primer/what-vector-network-analyzer-and-how-does-it-work> (Year: 2025).*

Computer translation of CN_1564457_A (Year: 2025).*

Computer translation of CN_114698404_B (Year: 2025).*

* cited by examiner

ELECTRONIC DEVICE AND METHOD FOR CALIBRATING TEMPERATURE RELATED SCATTERING MATRIX OF TEMPERATURE SENSITIVE DEVICE

BACKGROUND

The present invention is related to calibration of temperature sensitive devices, and more particularly, to an electronic device and a method for calibrating a temperature related scattering matrix of a temperature sensitive device.

In order to estimate an impedance of an output load, a scattering matrix (S-matrix) of a front-end device connected to the output load needs to be derived first. Related arts typically require a vector network analyzer (VNA) to directly probe the front-end device for estimating the S-matrix of the front-end device. However, utilizing the VNA to obtain information of the S-matrix during a mass production flow of electronic devices is time consuming for device testing. In addition, when the front-end device is temperature sensitive, the S-matrix may vary in response to temperature variation, and the estimation of the impedance of the output load may be inaccurate if the temperature is not fixed.

Thus, there is a need for a novel architecture and an associated method, to allow the S-matrix of the front-end device to be estimated and compensated under variant temperature without using the VNA.

SUMMARY

An objective of the present invention is to provide an electronic device and a method for calibrating a temperature related scattering matrix of a temperature sensitive device, which can estimate the temperature related scattering matrix with corresponding temperature calibration and compensation.

At least one embodiment of the present invention provides an electronic device. The electronic device comprises a temperature sensitive device and a calibration kit, wherein the calibration kit is connected to an output port of the temperature sensitive device. The temperature sensitive device is configured to transmit a desired signal and receive a forward signal and a reverse signal in response to the desired signal. The calibration kit is configured to provide a switchable impedance. During a first phase, the electronic device operates in a first temperature, and multiple first calculation results are calculated according to the forward signal and the reverse signal by setting the switchable impedance to be multiple impedances, respectively. During a second phase, the electronic device operates in a second temperature, and multiple second calculation results are calculated according to the forward signal and the reverse signal by setting the switchable impedance to be the multiple impedances, respectively. In addition, a temperature related scattering matrix (S-matrix) of the temperature sensitive device is calibrated according to the multiple first calculation results and the multiple second calculation results.

At least one embodiment of the present invention provides a method for calibrating a temperature related S-matrix of a temperature sensitive device. The method comprises: utilizing the temperature sensitive device to transmit a desired signal and receive a forward signal and a reverse signal in response to the desired signal; utilizing a calibration kit connected to an output port of the temperature sensitive device to provide a switchable impedance; during a first phase, configuring the temperature sensitive device to operate in a first temperature, and calculating multiple first calculation results according to the forward signal and the reverse signal by setting the switchable impedance to be multiple impedances, respectively; during a second phase, configuring the temperature sensitive device to operates in a second temperature, and calculating multiple second calculation results according to the forward signal and the reverse signal by setting the switchable impedance to be the multiple impedances, respectively; and calibrating the temperature related S-matrix of the temperature sensitive device according to the multiple first calculation results and the multiple second calculation results.

The electronic device and the method provided by the embodiments of the present invention can estimate the S-matrix under at least two different temperatures, to thereby estimate the impact of the S-matrix due to temperature variation, and corresponding calibration terms can be applied to the S-matrix. In addition, the embodiments of the present invention will not greatly increase additional costs. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ".

Figure 1:
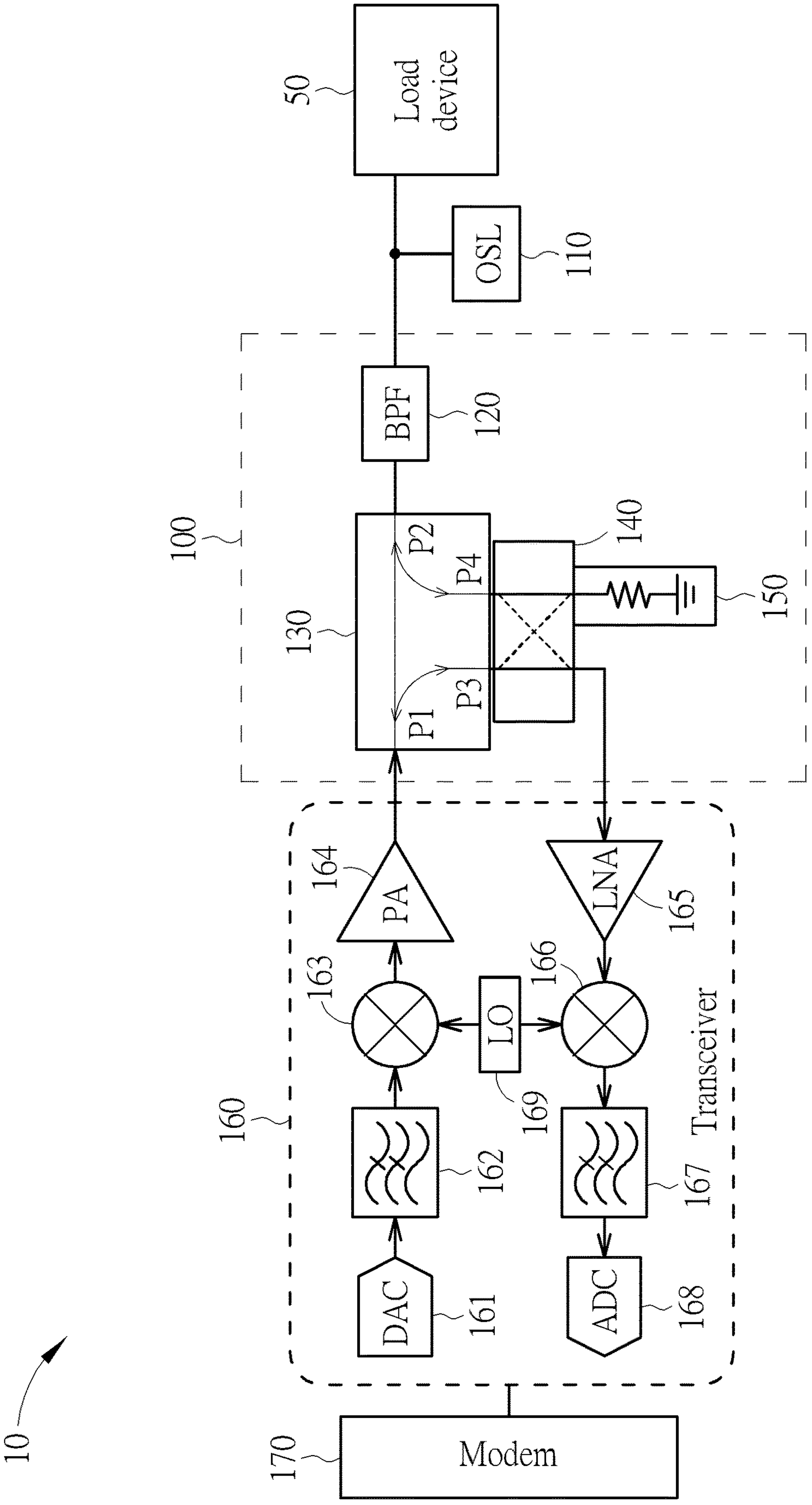
FIG. 1 is a diagram illustrating an electronic device according to an embodiment of the present invention.

FIG. 1 is a diagram illustrating an electronic device 10 according to an embodiment of the present invention. As shown in FIG. 1, the electronic device may comprise a load device 50, a temperature sensitive device 100, a calibration kit such as an open-short-load (OSL) kit 110 (labeled "OSL" in figures for brevity), a transceiver 160, and a processing circuit such as a modulator-demodulator (modem) 170. The OSL kit 110 is connected to an output port of the temperature sensitive device 100 (e.g. a right-side port thereof shown in FIG. 1). The temperature sensitive device 100 may comprise at least one temperature sensitive circuit such as a band pass filter (BPF) 120, a coupler 130, a switch circuit such as a double pole double throw (DPDT) switch 140, and a 50-ohm terminator 150. The coupler 130 comprises an input port P1 connected to the transceiver 160, an output port P2 connected to an input terminal of the BPF 120 (e.g. a left-side terminal thereof shown in FIG. 1), a coupled port P3 and an isolated port P4 connected to the DPDT switch 140. The DPDT switch 140 is connected to the 50-ohm terminator 150 and the transceiver 160. The transceiver 160 is connected between the modem 170 and the coupler 130. In detail, the transceiver 160 may comprise a digital-to-analog converter (DAC) 161, a filter 162, a mixer 163, a power amplifier 164, a low noise amplifier (LNA) 165, a mixer 166, a filter 167, an analog-to-digital converter (ADC) 168 and a local oscillator (LO) 169, where a signal path formed by the DAC 161, the filter 162, the mixer 163 and the power amplifier 164 may be regarded as a transmitting (TX) path, and a signal path formed by the LNA 165, the mixer 166, the filter 167 and the ADC 168 may be regarded as a receiving (RX) path. The input port P1 of the coupler 130 is connected to the TX path (more particularly, connected to the power amplifier 164) of the transceiver 160, and the DPDT switch 140 is connected to the RX path (more particularly, connected to the LNA 165) of the transceiver 160.

For a purpose of estimating an impedance on a node which is connected to the load device 50 without using a vector network analyzer (VNA), measurement can be performed on an input port of the temperature sensitive device 100 (e.g. a left-side port thereof shown in figures). A scattering matrix (S-matrix) from the input port of the temperature sensitive device 100 to the node connected to the load device 50 need to be derived first, and the impedance on the node connected to the load device 50 can be derived based on the measurement on the input port of the temperature sensitive device 100 and the S-matrix mentioned above. In practice, the BPF 120 is typically a temperature sensitive circuit, which makes the S-matrix mentioned above be temperature related. Thus, the present invention is aimed at estimating the impact on the S-matrix due to temperature variation, to thereby apply associated compensation term(s) to the S-matrix.

In this embodiment, the temperature sensitive device 100 is configured to transmit a desired signal and receive a forward signal and a reverse signal in response to the desired signal. In detail, the coupler 130 is configured to control signal transmission of the desired signal, the forward signal and the reverse signal. For example, the coupler 130 is configured to transmit the desired signal to the BPF 120 (e.g. from the input port P1 to the output port P2 of the coupler 130) and the DPDT switch 140 (which is connected to the coupled port P3 and the isolated port P4 of the coupler 130) and receive the forward signal (e.g. from the input port P1 to the coupled port P3 of the coupler 130) and the reverse signal from the BPF 120 (e.g. from the output port P2 to the isolated port P4 of the coupler 130) from the BPF 120. In addition, the OSL kit 110 is configured to provide a switchable impedance.

During a first phase, the electronic device 10 may operate in a first temperature, and multiple first calculation results may be calculated according to the forward signal and the reverse signal by setting the switchable impedance to be multiple impedances, respectively. During a second phase, the electronic device 10 may operate in a second temperature, and multiple second calculation results may be calculated according to the forward signal and the reverse signal by setting the switchable impedance to be the multiple impedances, respectively. Furthermore, a temperature related S-matrix of the temperature sensitive device 100 (which may be an example, of the S-matrix from the input port of the temperature sensitive device 100 to the node connected to the load device 50 mentioned above) can be calibrated according to the multiple first calculation results and the multiple second calculation results.

In this embodiment, the modem 170 is configured to generate the multiple first calculation results according to the forward signal and the reverse signal during the first phase and generate the multiple second calculation results according to the forward signal and the reverse signal during the second phase. In addition, the modem 170 may calibrate the temperature related S-matrix according to the multiple first calculation results and the multiple second calculation results. In detail, the TX path of the transceiver 160 may transmit the desired signal to the coupler 130, and the RX path of the transceiver 160 may receive the forward signal via the coupled port P3 of the coupler 130 and receive the reverse signal via the isolated port P4 of the coupler 130, to allow the modem 170 to receive the forward signal and the reverse signal via the transceiver 160. In addition, the DPDT switch 140 is configured to selectively connect the coupled port P3 of the coupler 130 to the RX path of the transceiver 160 or connect the isolated port P4 of the coupler 130 to the RX path of the transceiver 160. Thus, the transceiver 160 may receive the forward signal for the modem 170 when the DPDT switch 140 connects the coupled port P3 to the RX path of the transceiver 160, and the transceiver 160 may receive the reverse signal for the modem 170 when the DPDT switch 140 connects the isolated port P4 to the RX path of the transceiver 160.

As the multiple first calculation results are generated according to the forward signal and the reverse signal which are measured under the first temperature, a first S-matrix corresponding to the first temperature can be derived according to the multiple first calculation results (e.g. calculated according to the multiple first calculation results by the modem 170). In addition, as the multiple second calculation results are generated according to the forward signal and the reverse signal which are measured under the second temperature, a second S-matrix corresponding to the second temperature can be derived according to the multiple second calculation results (e.g. calculated according to the multiple second calculation results by the modem 170). Thus, the modem 170 may calibrate the temperature related S-matrix according to the first S-matrix and the second S-matrix.

Figure 2:
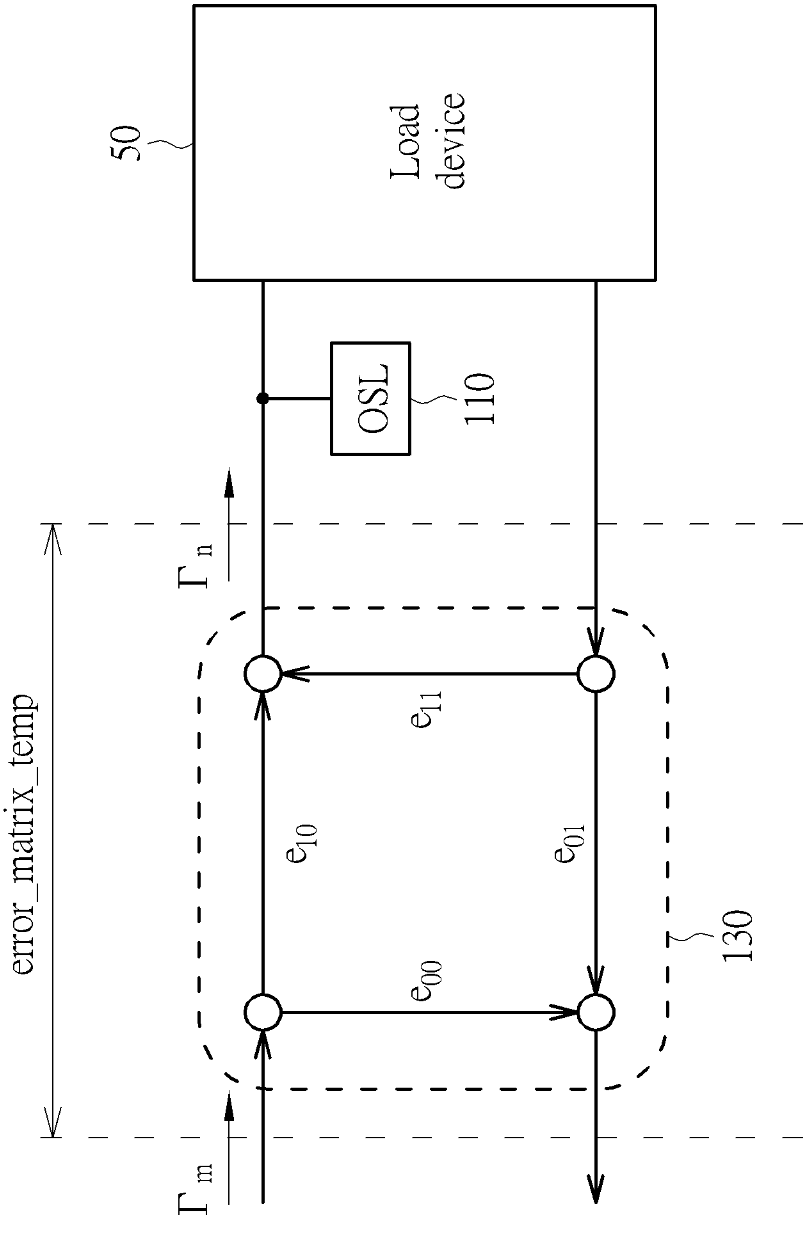
FIG. 2 is a diagram illustrating a mathematical model for deriving a scattering matrix (S-matrix) of a temperature sensitive device according to an embodiment of the present invention.

FIG. 2 is a diagram illustrating a mathematical model for deriving the temperature related S-matrix of the temperature sensitive device 100 according to an embodiment of the present invention, where $\{e_{00}, e_{10}, e_{01}, e_{11}\}$ may represent scattering parameters (S-parameters) of the temperature sensitive device 100. In this embodiment, an impedance on the input port P1 of the coupler 130 may be represented by $\Gamma_m$ (which can be calculated according to the forward signal and the reverse signal), and the impedance on the node connected to the load device 50 may be represented by $\Gamma_n$.

During the first phase, the electronic device 10 may operate in the first temperature, and multiple results of the impedance $\Gamma_m$ can be derived by measuring the forward signal and the reverse signal under conditions of different values of the switchable impedance of the OSL kit 110. For example, the impedance $\Gamma_m$ may be $\Gamma_{m1}$ when the switchable impedance of the input OSL kit 110 is set to be $\Gamma_{a1}$, the impedance $\Gamma_m$ may be $\Gamma_{m2}$ when the input switchable impedance of the input OSL kit 110 is set to be $\Gamma_{a2}$, and the impedance $\Gamma_m$ may be $\Gamma_{m3}$ when the input switchable impedance of the input OSL kit 110 is set to be $\Gamma_{a3}$, where the impedances $\Gamma_{m1}$, $\Gamma_{m2}$ and $\Gamma_{m3}$ derived during the first phase (e.g. the impedances $\Gamma_{m1}$, $\Gamma_{m2}$ and $\Gamma_{m3}$ derived under a condition where the electronic device 10 operates in the first temperature) may be examples of the multiple first calculation results, and an equation related to the above parameters may be derived according to the first S-matrix such as an error matrix error_matrix_temp(temp1) characterized by parameters {x_temp1, y_temp1, z_temp1} as follows:

$$\begin{bmatrix} \text{x\_temp1} \\ \text{y\_temp1} \\ \text{z\_temp1} \end{bmatrix} = \begin{bmatrix} \Gamma_{a1} & 1 & -\Gamma_{a1}\Gamma_{m1} \\ \Gamma_{a2} & 1 & -\Gamma_{a2}\Gamma_{m2} \\ \Gamma_{a3} & 1 & -\Gamma_{a3}\Gamma_{m3} \end{bmatrix}^{-1} \begin{bmatrix} \Gamma_{m1} \\ \Gamma_{m2} \\ \Gamma_{m3} \end{bmatrix},$$

$$\text{where } \begin{bmatrix} \text{x\_temp1} \\ \text{y\_temp1} \\ \text{z\_temp1} \end{bmatrix} = \begin{bmatrix} e_{10}e_{01} - e_{00}e_{11} \\ e_{00} \\ -e_{11} \end{bmatrix}$$

In this embodiment, the impedances $\Gamma_{a1}$, $\Gamma_{a2}$, $\Gamma_{a3}$ are different from one another. More particularly, it is preferred to make the impedances $\Gamma_{a1}$, $\Gamma_{a2}$ and $\Gamma_{a3}$ be as much far as possible in Smith Chart. For example, the OSL kit 110 may be configured as an open circuit, a short circuit and a predetermined load (e.g. 50-ohm load), respectively, making $\Gamma_{a1}=1$ (the open circuit), $\Gamma_{a2}=-1$ (the short circuit) and $\Gamma_{a3}=0$ (the predetermined load). Thus, the S-parameters $e_{00}$ and $e_{11}$ and a product of the S-parameters $e_{10}$ and $e_{01}$ can be derived during the first phase, which may be examples of the multiple first calculation results. More particularly, a parameter $e_{10}e_{01}$(temp1) may represent the product of the S-parameters $e_{10}$ and $e_{01}$ under the first temperature, where the parameter $e_{10}e_{01}$(temp1)=x_temp1−y_temp1×z_temp1, and a phase $\text{phase}_{temp1}$ (e.g. a phase of the parameter $e_{10}e_{01}$ (temp1)) corresponding to the error matrix error_matrix_temp(temp1) can be calculated.

During the second phase, the electronic device 10 may operate in the second temperature. By a procedure similar to that of the first phase, the impedances $\Gamma_{m1}$, $\Gamma_{m2}$ and $\Gamma_{m3}$ can be derived by measuring the forward signal and the reverse signal under conditions of different values of the calibration impedance of the OSL kit 110, where the impedances $\Gamma_{m1}$, $\Gamma_{m2}$ and $\Gamma_{m3}$ derived during the second phase (e.g. the impedances $\Gamma_{m1}$, $\Gamma_{m2}$ and $\Gamma_{m3}$ derived under a condition where the electronic device 10 operates in the second temperature) may be examples of the multiple second calculation results, and another equation may be derived according to the second S-matrix such as an error matrix error_matrix_temp(temp2) characterized by parameters {x_temp2, y_temp2, z_temp2} as follows:

$$\begin{bmatrix} \text{x\_temp2} \\ \text{y\_temp2} \\ \text{z\_temp2} \end{bmatrix} = \begin{bmatrix} \Gamma_{a1} & 1 & -\Gamma_{a1}\Gamma_{m1} \\ \Gamma_{a2} & 1 & -\Gamma_{a2}\Gamma_{m2} \\ \Gamma_{a3} & 1 & -\Gamma_{a3}\Gamma_{m3} \end{bmatrix}^{-1} \begin{bmatrix} \Gamma_{m1} \\ \Gamma_{m2} \\ \Gamma_{m3} \end{bmatrix},$$

$$\text{where } \begin{bmatrix} \text{x\_temp2} \\ \text{y\_temp2} \\ \text{z\_temp2} \end{bmatrix} = \begin{bmatrix} e_{10}e_{01} - e_{00}e_{11} \\ e_{00} \\ -e_{11} \end{bmatrix}$$

As mentioned above, the impedances $\Gamma_{a1}$, $F_{a2}$, $\Gamma_{a3}$ are different from one another. More particularly, it is preferred to make the impedances $\Gamma_{a1}$, $\Gamma_{a2}$ and $F_{a3}$ be as much far as possible in Smith Chart. For example, the OSL kit 110 may be configured as an open circuit, a short circuit and a predetermined load (e.g. 50-ohm load), respectively, making $\sigma_{a1}=1$ (the open circuit), $\Gamma_{a2}=-1$ (the short circuit) and $\Gamma_{a3}=0$ (the predetermined load). Thus, the S-parameters $e_{00}$ and $e_{11}$ and the product of the S-parameters $e_{10}$ and $e_{01}$ can be derived during the second phase, which may be examples of the multiple second calculation results. More particularly, a parameter $e_{10}e_{01}$(temp2) may represent the product of the S-parameters $e_{10}$ and $e_{01}$ under the second temperature, where the parameter $e_{10}e_{01}$(temp2)=x_temp2−y_temp2×z_temp2, and a phase $\text{phase}_{temp2}$ (e.g. a phase of the parameter $e_{10}e_{01}$(temp2)) corresponding to the error matrix error_matrix_temp(temp2) can be calculated.

Based on the above derivation, the modem 170 may calibrate the temperature related S-matrix such as an error matrix error_matrix_temp according to the error matrix error_matrix_temp(temp1) and the error matrix error_matrix_temp(temp2). More particularly, a temperature-to-phase relationship of the error matrix error_matrix_temp is generated according to the phase $\text{phase}_{temp1}$ corresponding to the error matrix error_matrix_temp(temp1) and the phase $\text{phase}_{temp2}$ corresponding to the error matrix error_matrix_temp(temp2). For example, a compensation coefficient α related to the temperature-to-phase relationship may be calculated according to a phase difference between the phase $\text{phase}_{temp1}$ and the phase $\text{phase}_{temp2}$ and a temperature difference between the first temperature (which may be represented by temp1) and the second temperature (which may be represented by temp2) as follows:

$$\alpha = \frac{\text{phase}_{temp2} - \text{phase}_{temp1}}{temp2 - temp1}$$

According the above derivation, the temperature related S-matrix such as the error matrix error_matrix_temp under an arbitrary temperature temp may be expressed as follows:

$$\text{error\_matrix\_temp} = \begin{bmatrix} (\text{x\_temp1} - \text{y\_temp1} \times \text{z\_temp1}) \times e^{j \times \alpha \times (temp - temp1)} + \text{y\_temp1} \times \text{z\_temp1} \\ \text{y\_temp1} \\ \text{z\_temp1} \end{bmatrix}$$

By applying the above equation, the temperature related S-matrix may be calibrated regarding the temperature variation.

It should be noted that the temperature-to-phase relationship can be derived according to conditions of at least two temperatures (e.g. two or more temperatures). In addition, the temperature-to-phase relationship is not limited to be modeled as a linear relationship. For example, the temperature-to-phase relationship may be modeled as a polynomial function for being applied to the temperature related S-matrix, but the present invention is not limited thereto.

In addition, the above calibration merely considers impacts on phases of the parameters within the error matrix error_matrix_temp, where impacts on gains of the parameters within the error matrix error_matrix_temp are ignored, but the present invention is not limited thereto. For example, a temperature-to-gain relationship of the temperature related S-matrix may be generated according to a first gain corresponding to the first S-matrix (e.g. a gain of any of the parameters $e_{10}e_{01}-e_{00}e_{11}$, $e_{00}$ and $e_{11}$ derived under the first temperature) and a second gain corresponding to the second S-matrix (e.g. a gain of any of the parameters $e_{10}e_{01}$-$e_{00}e_{11}$, $e_{00}$ and $e_{11}$ derived under the first temperature). A compensation coefficient related to the temperature-to-gain relationship is calculated according to a gain difference between the first gain and the second gain and a temperature difference between the first temperature and the second temperature.

In one embodiment, the temperature related S-matrix such as the error matrix error_matrix_temp under an arbitrary temperature temp may be obtain by considering both a gain error and a phase error of each parameter within the error matrix error_matrix_temp caused by temperature variation, such as the gain error and the phase error of a parameter Δe (e.g. $\Delta e=e_{10}e_{01}-e_{00}e_{11}$), the gain error and the phase error of the parameter $e_{00}$, and the gain error and the phase error of the parameter $e_{11}$. In detail, the electronic device 10 may be set to operate in multiple temperatures (e.g. temperatures $T_0$, $T_1$, . . . , and $T_N$, where N is a positive integer) to derive the parameters Δe, $e_{00}$ and $e_{11}$ under the multiple temperatures, and the gain error and the phase error of each of the parameters Δe, $e_{00}$ and $e_{11}$ can be derived for estimating the error matrix error_matrix_temp with respect to an arbitrary temperature temp.

For example, the electronic device 10 may be set to operate in a temperature $T_n$, where $T_n$ may be any of the temperatures $T_0$, $T_1$, . . . , and $T_N$. The impedance $\Gamma_m$ can be derived by measuring the forward signal and the reverse signal under the conditions of the different values of the switchable impedance of the OSL kit 110. For example, the impedance $\Gamma_m$ may be $\Gamma_{m1}(T_n)$ when the switchable impedance of the input OSL kit 110 is set to be Fai under the temperature $T_n$, the impedance $\Gamma_m$ may be $\Gamma_{m2}(T_n)$ when the input switchable impedance of the input OSL kit 110 is set to be $\Gamma_{a2}$ under the temperature $T_n$, and the impedance $\Gamma_m$ may be $\Gamma_{m3}(T_n)$ when the input switchable impedance of the input OSL kit 110 is set to be $\Gamma_{a3}$ under the temperature $T_n$. Thus, the parameters Δe, $e_{00}$ and $e_{11}$ under the temperature $T_n$, such as $\Delta e(T_n)$, $e_{00}(T_n)$ and $e_{11}(T_n)$, may be derived as follows:

$$\begin{bmatrix} \Delta e(T_n) \\ e_{00}(T_n) \\ -e_{11}(T_n) \end{bmatrix} = \begin{bmatrix} \Gamma_{a1} & 1 & -\Gamma_{a1}\Gamma_{m1}(T_n) \\ \Gamma_{a2} & 1 & -\Gamma_{a2}\Gamma_{m2}(T_n) \\ \Gamma_{a3} & 1 & -\Gamma_{a3}\Gamma_{m3}(T_n) \end{bmatrix}^{-1} \begin{bmatrix} \Gamma_{m1}(T_n) \\ \Gamma_{m2}(T_n) \\ \Gamma_{m3}(T_n) \end{bmatrix}$$

As mentioned above, it is preferred to make the impedances $\Gamma_{a1}$, $\Gamma_{a2}$ and $\Gamma_{a3}$ be as much far as possible in Smith Chart. Thus, the OSL kit 110 may be configured as an open circuit, a short circuit and a predetermined load (e.g. 50-ohm load), respectively, making $\Gamma_{a1}=1$ (the open circuit), $\Gamma_{a2}=-1$ (the short circuit) and $\Gamma_{a3}=0$ (the predetermined load), but the present invention is not limited thereto.

By setting the temperature $T_n$ to be $T_0$, $T_1$, . . . , and $T_N$, multiple calculation results of the parameters $\Delta e(T_n)$, $e_{00}(T_n)$ and $e_{11}(T_n)$ under these temperatures can be derived, such as $\{\Delta e(T_0), e_{00}(T_0), e_{11}(T_0)\}$, $\{\Delta e(T_1), e_{00}(T_1), e_{11}(T_1)\}$ and $\{\Delta e(T_2), e_{00}(T_2), e_{11}(T_2)\}$. With these calculation results, compensation coefficients (e.g. a gain compensation coefficient and a phase compensation coefficient) of each of the parameters $\Delta e(T_n)$, $e_{00}(T_n)$ and $e_{11}(T_n)$ may be further estimated. For example, a phase slope pa (e.g. a phase error rate with respect to temperature variation) of the parameter Δe may be calculated according to phase values of $\{\Delta e(T_0), \Delta e(T_1), \ldots, \Delta e(T_N)\}$, and a gain slope $g_d$ (e.g. a gain error rate with respect to temperature variation) of the parameter Δe may be calculated according to gain values (e.g. amplitude values) of $\{\Delta e(T_0), \Delta e(T_1), \ldots, \Delta e(T_N)\}$. A phase slope $p_0$ (e.g. a phase error rate with respect to temperature variation) of the parameter $e_{00}$ may be calculated according to phase values of $\{e_{00}(T_0), e_{00}(T_1), \ldots, e_{00}(T_N)\}$, and a gain slope $g_0$ (e.g. a gain error rate with respect to temperature variation) of the parameter $e_{00}$ may be calculated according to gain values (e.g. amplitude values) of $\{e_{00}(T_0), e_{00}(T_1), \ldots, e_{00}(T_N)\}$. A phase slope $p_1$ (e.g. a phase error rate with respect to temperature variation) of the parameter $e_{11}$ may be calculated according to phase values of $\{e_{11}(T_0), e_{11}(T_1), \ldots, e_{11}(T_N)\}$, and a gain slope $g_1$ (e.g. a gain error rate with respect to temperature variation) of the parameter $e_{11}$ may be calculated according to gain values (e.g. amplitude values) of $\{e_{11}(T_0), e_{11}(T_1), \ldots, e_{11}(T_N)\}$.

According to the compensation coefficients mentioned above (e.g. the phase slope $p_d$, the gain slope $g_d$, the phase slope $p_0$, the gain slope $g_0$, the phase slope $p_1$ and the gain slope $g_1$), the parameters Δe, $e_{00}$ and $e_{11}$ with respect to a present temperature T, such as $\Delta e(T)$, $e_{00}(T)$ and $e_{11}(T)$ may be expresses as follows:

$$\Delta e(T) = \Delta e(T_r)(1 + g_d(T - T_r))e^{jp_d(T-T_r)}$$

$$e_{00}(T) = e_{00}(T_r)(1 + g_0(T - T_r))e^{jp_0(T-T_r)}$$

$$e_{11}(T) = e_{11}(T_r)(1 + g_1(T - T_r))e^{jp_1(T-T_r)}$$

$T_r$ may represent a temperature of which corresponding OSL calibration is done. That is, the parameters Δe, $e_{00}$ and $e_{11}$ under the temperature $T_r$, such as $\Delta e(T_r)$, $e_{00}(T_r)$ and $e_{11}(T_r)$, are known (e.g. any of the temperatures $T_0$, $T_1$, . . . , and $T_N$ may be an example of the temperature $T_r$). Thus, when the temperature changes to the present temperature T, the parameters $\Delta e(T)$, $e_{00}(T)$ and $e_{11}(T)$ under the present temperature T can be updated based on the known parameters such as $\Delta e(T_r)$, $e_{00}(T_r)$ and $e_{11}(T_r)$ and the present temperature T with the equations shown above, in order to compensate the error caused by the temperature variation.

Figure 3:
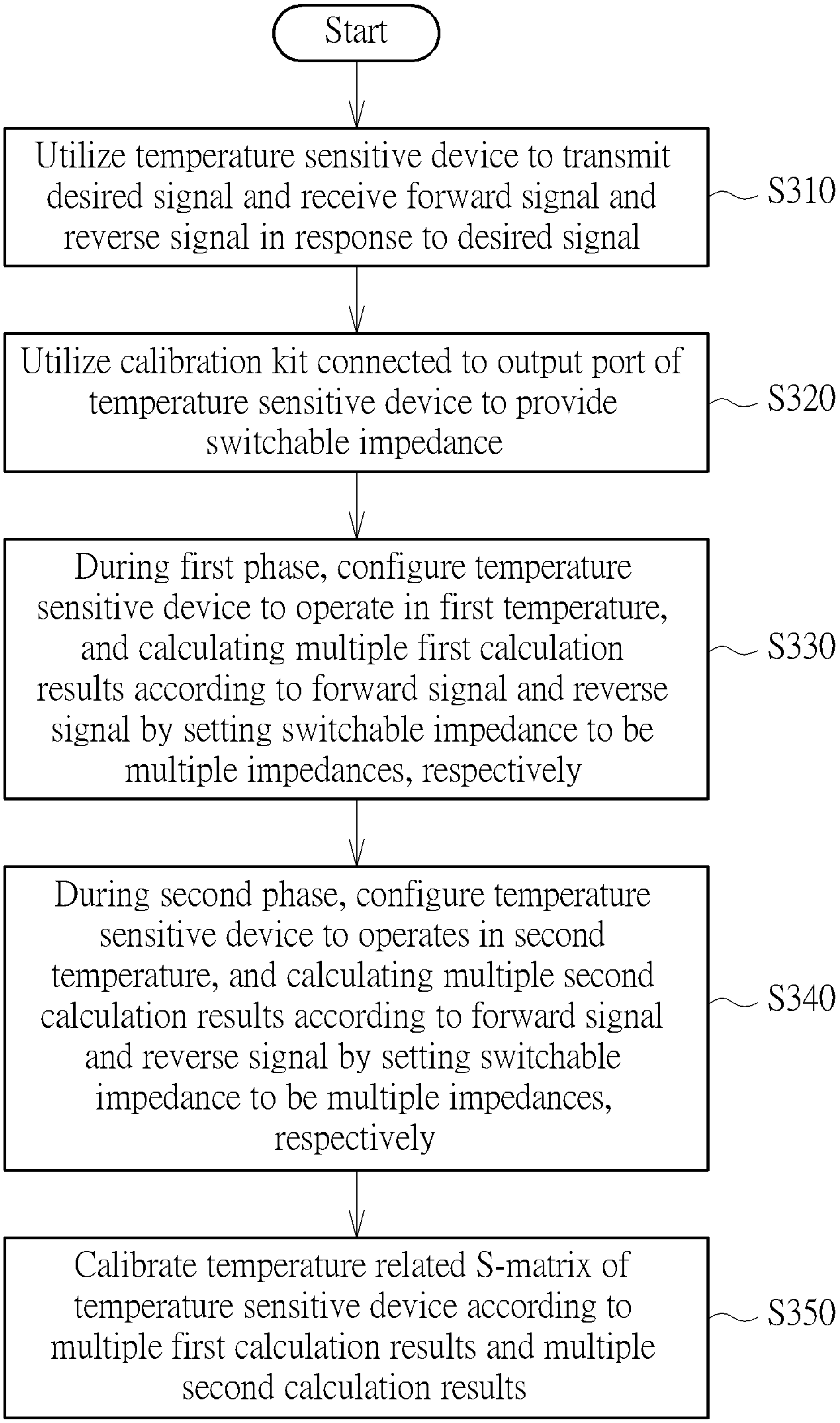
FIG. 3 is a diagram illustrating a working flow of a method for calibrating a temperature related S-matrix of a temperature sensitive device according to an embodiment of the present invention.

FIG. 3 is a diagram illustrating a working flow of a method for calibrating a temperature related S-matrix of a temperature sensitive device according to an embodiment of the present invention, where the working flow may be executed by the electronic device 10 shown in FIG. 1. It should be noted that the working flow is for illustrative purposes only, and is not meant to be a limitation of the present invention. For example, one or more steps may be added, deleted or modified in the working flow shown in FIG. 3. In addition, if a same result may be obtained, these steps do not have to be executed in the exact order shown in FIG. 3.

In Step S310, the electronic device 10 may utilize the temperature sensitive device 100 to transmit a desired signal and receive a forward signal and a reverse signal in response to the desired signal.

In Step S320, the electronic device 10 may utilize the calibration kit 110 connected to the output port of the temperature sensitive device 100 to provide a switchable impedance.

In Step S330, during a first phase, the electronic device 10 may configure the temperature sensitive device 100 to operate in a first temperature, and calculate multiple first calculation results according to the forward signal and the reverse signal by setting the switchable impedance to be multiple impedances, respectively.

In Step S340, during a second phase, the electronic device 10 may configure the temperature sensitive device 100 to operates in a second temperature, and calculate multiple second calculation results according to the forward signal and the reverse signal by setting the switchable impedance to be the multiple impedances, respectively.

In Step S350, the electronic device 10 may calibrate the temperature related S-matrix of the temperature sensitive device 100 according to the multiple first calculation results and the multiple second calculation results.

$T_0$ summarize, the electronic device 10 and the method provided by the embodiments of the present invention can utilize the OSL kit 110 to derive the temperature related S-matrix under different temperature, to thereby calculate associated term(s) for calibrating the temperature related S-matrix. In addition, the embodiments of the present invention will not greatly increase overall costs. Thus, the present invention can solve the problem of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:

a temperature sensitive device, configured to transmit a desired signal and receive a forward signal and a reverse signal in response to the desired signal, the temperature sensitive device comprising:

a temperature sensitive circuit, having an output terminal connected to a calibration kit; and a coupler, connected to an input terminal of the temperature sensitive circuit, configured to transmit the desired signal and receive the forward signal and the reverse signal from the temperature sensitive circuit;

the calibration kit, connected to the output terminal of the temperature sensitive device, configured to provide a switchable impedance;

a processing circuit, configured to generate multiple first calculation results and multiple second calculation results according to the forward signal and the reverse signal, and calibrate a temperature related scattering matrix (S-matrix) of the temperature sensitive device according to the multiple first calculation results and the multiple second calculation results; and a transceiver, connected between the processing circuit and the coupler, wherein a transmitting path of the transceiver transmits the desired signal to the coupler, and a receiving path of the transceiver receives the forward signal via a coupled port of the coupler and receives the reverse signal via an isolated port of the coupler, to allow the processing circuit to receive the forward signal and the reverse signal via the transceiver;

wherein:

during a first phase, the electronic device operates in a first temperature, and the multiple first calculation results are calculated according to the forward signal and the reverse signal by setting the switchable impedance to be multiple impedances, respectively; and during a second phase, the electronic device operates in a second temperature, and the multiple second calculation results are calculated according to the forward signal and the reverse signal by setting the switchable impedance to be the multiple impedances, respectively.

2. The electronic device of claim 1, wherein the multiple impedances are different from one another.

3. The electronic device of claim 2, wherein the multiple impedances comprise a first impedance, a second impedance and a third impedance, and the first impedance, the second impedance and the third impedance are generated by configuring the calibration kit as an open circuit, a short circuit and a predetermined load, respectively.

4. The electronic device of claim 1, wherein the temperature sensitive device further comprises:

a switch circuit, connected to the coupler and the transceiver, configured to selectively connect the coupled port of the coupler to the receiving path of the transceiver or connect the isolated port of the coupler to the receiving path of the transceiver.

5. The electronic device of claim 1, wherein a first S-matrix corresponding to the first temperature is derived according to the multiple first calculation results, and a second S-matrix corresponding to the second temperature is derived according to the multiple second calculation results, wherein the temperature related S-matrix is calibrated according to the first S-matrix and the second S-matrix.

6. The electronic device of claim 5, wherein a temperature-to-phase relationship of the temperature related S-matrix is generated according to a first phase corresponding to the first S-matrix and a second phase corresponding to the second S-matrix.

7. The electronic device of claim 6, wherein a compensation coefficient related to the temperature-to-phase relationship is calculated according to a phase difference between the first phase and the second phase and a temperature difference between the first temperature and the second temperature.

8. The electronic device of claim 5, wherein a temperature-to-gain relationship of the temperature related S-matrix is generated according to a first gain corresponding to the first S-matrix and a second gain corresponding to the second S-matrix.

9. The electronic device of claim 8, wherein a compensation coefficient related to the temperature-to-gain relationship is calculated according to a gain difference between the first gain and the second gain and a temperature difference between the first temperature and the second temperature.

10. A method for calibrating a temperature related scattering matrix (S-matrix) of a temperature sensitive device, comprising:

utilizing the temperature sensitive device to transmit a desired signal and receive a forward signal and a reverse signal in response to the desired signal;

utilizing a calibration kit connected to an output terminal of the temperature sensitive device to provide a switchable impedance;

during a first phase, configuring the temperature sensitive device to operate in a first temperature, and calculating multiple first calculation results according to the forward signal and the reverse signal by setting the switchable impedance to be multiple impedances, respectively;

during a second phase, configuring the temperature sensitive device to operate in a second temperature, and calculating multiple second calculation results according to the forward signal and the reverse signal by setting the switchable impedance to be the multiple impedances, respectively; and calibrating the temperature related S-matrix of the temperature sensitive device according to the multiple first calculation results and the multiple second calculation results;

wherein the temperature sensitive device comprises a temperature sensitive circuit having the output terminal connected to the calibration kit and a coupler connected to an input terminal of the temperature sensitive circuit, and utilizing the temperature sensitive device to transmit the desired signal and receive the forward signal and the reverse signal in response to the desired signal comprises:

utilizing the coupler to transmit the desired signal and receive the forward signal and the reverse signal from the temperature sensitive circuit; and the method further comprises:

utilizing a transmitting path of a transceiver connected between a processing circuit and the coupler to transmit the desired signal to the coupler;

utilizing a receiving path of the transceiver to receive the forward signal via a coupled port of the coupler and receive the reverse signal via an isolated port of the coupler; and utilizing a processing circuit to receive the forward signal and the reverse signal via the receiving path of the transceiver, to allow the processing circuit to generate the multiple first calculation results and the multiple second calculation results according to the forward signal and the reverse signal and thereby calibrate the temperature related S-matrix according to the multiple first calculation results and the multiple second.

11. The method of claim 10, wherein the multiple impedances are different from one another.

12. The method of claim 11, wherein the multiple impedances comprise a first impedance, a second impedance and a third impedance, and the first impedance, the second impedance and the third impedance are generated by configuring the calibration kit as an open circuit, a short circuit and a predetermined load, respectively.

13. The method of claim 10, further comprising:

utilizing a switch circuit to selectively connect the coupled port of the coupler to the receiving path of the transceiver or connect the isolated port of the coupler to the receiving path of the transceiver.

14. The method of claim 10, wherein a first S-matrix corresponding to the first temperature is derived according to the multiple first calculation results, and a second S-matrix corresponding to the second temperature is derived according to the multiple second calculation results, and calibrating the temperature related S-matrix of the temperature sensitive device according to the multiple first calculation results and the multiple second calculation results comprises:

calibrating the temperature related S-matrix according to the first S-matrix and the second S-matrix.

15. The method of claim 14, wherein calibrating the temperature related S-matrix according to the first S-matrix and the second S-matrix comprises:

generating a temperature-to-phase relationship of the temperature related S-matrix according to a first phase corresponding to the first S-matrix and a second phase corresponding to the second S-matrix.

16. The method of claim 15, wherein generating the temperature-to-phase relationship of the temperature related S-matrix according to the first phase corresponding to the first S-matrix and the second phase corresponding to the second S-matrix comprises:

calculating a compensation coefficient related to the temperature-to-phase relationship according to a phase difference between the first phase and the second phase and a temperature difference between the first temperature and the second temperature.

* * * * *